(12) United States Patent
Negishi

(10) Patent No.: US 6,272,013 B2
(45) Date of Patent: *Aug. 7, 2001

(54) UNIT HOUSING STRUCTURE IN ELECTRONIC DEVICE

(75) Inventor: Masayuki Negishi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/280,845

(22) Filed: Mar. 30, 1999

(30) Foreign Application Priority Data

Mar. 31, 1998 (JP) .................................. 10-087660

(51) Int. Cl.$^7$ ..................................... H05K 7/20
(52) U.S. Cl. ...................... 361/695; 248/41.17; 312/236; 361/727; 361/802
(58) Field of Search ..................................... 361/679, 683, 361/724, 725, 727, 728, 730, 731, 741, 752, 796, 695, 797, 802, 608; 312/334.7, 223.1, 223.2, 236; 248/41.17

(56) References Cited

U.S. PATENT DOCUMENTS

| 3,169,214 | * | 2/1965 | Whitehorn . |
| 3,731,157 | * | 5/1973 | Reimer . |
| 3,733,523 | * | 5/1973 | Reynolds . |
| 4,519,016 | * | 5/1985 | Bradley . |
| 5,332,306 | * | 7/1994 | Babb et al. ...................... 312/334.16 |
| 5,494,354 | * | 2/1996 | Tsukada ................................ 384/13 |
| 5,549,390 | * | 8/1996 | Reitberger .............................. 384/44 |
| 5,708,552 | * | 1/1998 | Han et al. ............................. 361/799 |

FOREIGN PATENT DOCUMENTS

| 62-108617 | 7/1987 | (JP) . |
| 63-131176 | 8/1988 | (JP) . |
| 5-48390 | 6/1993 | (JP) . |

OTHER PUBLICATIONS

Japanese Office Action, dated Nov. 2, 1999, with English language translation of Japanese Examiner's comments.

* cited by examiner

*Primary Examiner*—Gerald Tolin
(74) *Attorney, Agent, or Firm*—McGuireWoods LLP

(57) ABSTRACT

A unit housing structure for detachably housing a unit mounted with electronic parts in a unit mounting portion of an electronic device in which a guide rail having a guide slot whose opposite wall surfaces are slopes gradually opening outwardly is provided on the side of said unit mounting portion or said unit and a guided portion to be slidably engaged with the guide slot of said guide rail is provided on the side of said unit mounting portion or said unit, whereby movement of said unit is guided by the engagement between said guided portion and the guide slot at the time of insertion/extraction of said unit into/from said unit mounting portion.

15 Claims, 7 Drawing Sheets

UNIT HOUSING STRUCTURE IN ELECTRONIC DEVICE

BACKGROUND OF THE INVENTION

1. Field of the Invention

The present invention relates to a unit housing structure in an electronic device provided with a guide structure for smoothly guiding a detachable unit portion to a predetermined position in a unit mounting portion.

2. Description of the Related Art

In an electronic device composed of a plurality of printed boards packaged on a shelf, for example, in a communication apparatus, heat generation from the printed boards is a problem. Structure for emitting the heat outside is therefore employed. Commonly employed as this cooling method is forced air cooling using a fan. The fan has a certain life expectancy, but may encounter trouble prior to the expiration of its known life expectancy. For facilitating maintenance and replacement, therefore, it is a common practice for a fan unit to be structured to be detachable from the front side of a unit mounting portion in the body of a device.

Furthermore, since the fan unit needs to supply power or transmit an alarm signal or the like when the number of revolutions of the fan is reduced, the unit requires electrical connection with the device side. The fan unit and the unit mounting portion of the device are therefore both designed to have a connector through which the fan unit and the unit mounting portion are electrically connected.

In addition, for reliably connecting the connectors, the fan unit should be guided such that the connectors face each other while positioned with respect to each other. For this guiding, a guide rail with a groove for guiding is disposed on the side of the unit mounting portion.

Commonly used as this guide rail is a rail having a U-shaped slot whose opposite sides rise vertically to the bottom surface (hereinafter, referred to as a U slot). The fan unit is guided by engaging a guided portion on the fan unit side with this U slot and sliding the guided portion within the U slot. Here, between the U slot of the guide rail and the guided portion of the fan unit, "the width of the U slot is greater than the width of the guided portion" holds and the two are designed to have a little clearance therebetween.

It is ideal that insertion or extraction of the fan unit into or from the unit mounting portion is conducted while keeping the U slot of the guide rail and the guided portion of the fan unit in parallel to each other at any time.

Among modes of a fan unit are a mode of laterally mounting a plurality of fan units each having a few fans so as to meet cooling design or a design concept of an electronic device and a mode of mounting a fan unit large in breadth having numbers of fans thereon. In either mode, for guiding a fan unit large in breadth by a U slot of a guide rail, operating the U slot of the guide rail and a guided portion of the unit while constantly keeping them in parallel with each other is difficult and the unit is highly likely to slant with its left side or right side projecting forward. As a result, an apparent width of the guided portion of the fan unit equals or exceeds the width of the U slot of the guide rail, whereby the guided portion of the fan unit will be pressed against the inner wall surface of the U slot to hitch halfway in the insertion or extraction.

In a case where a right and left slant is to be corrected for rectifying this state, when the amount of rectification is too large, a right and left slant reverse to that before will cause a hitch. Insertion and extraction are highly likely to be conducted through the repetition of this movement to rock the unit leftward and rightward alternately in the traveling direction and cause a hitch. This tendency is more enhanced as the breadth of the fan unit is increased.

Under these circumstances, there is a demand for a unit housing structure provided with a guide structure which enables smooth insertion and extraction without a hitch caused by rocking from side to side.

FIGS. 11 and 12 show one example of a conventional housing structure and FIG. 11 is a perspective view showing a broken-out section of a part of the schematic structure of the housing structure and FIG. 12 is an expanded sectional view taken along line B—B of FIG. 11. More specifically, shown are one example of a fan unit 110 large in breadth having a plurality of fans 175 provided thereon and a fan unit mounting portion 120 in which the fan unit 110 is to be mounted. Although not shown, the fan unit mounting portion 120 is disposed within an electronic device such as a communication apparatus.

In more detail, the fan unit mounting portion 120 has a connector 130 for the connection with the fan unit 110. The connector 130 is connected to the inside of the electronic device by a cable to allow power supply to the fan unit 110 or detect an alarm signal or the like generated from the fan unit 110 due to the reduction of the number of revolutions of the fan. On the left side on cross-beams 180 and 190 of the fan unit mounting portion 120, a guide rail 140 for guiding the fan unit 110 is provided. The guide rail 140, as illustrated in FIG. 12, forms a U slot 170 having its wall surfaces rising perpendicularly to the bottom surface by which the U slot 170 guides the fan unit 110.

On the other hand, the fan unit 110 has a connector 150 at a position opposed to the connector 130 of the fan unit mounting portion 120. In addition, the lower edge of the side surface of the fan unit 110 projects to become a guided portion 160 which will be guided while being fit in the U slot 170 of the guide rail 140. Here, the width of the U slot 170 of the guide rail 140 has a dimension with a little clearance with respect to the board thickness of the side surface of the fan unit 110, that is, the width of the guided portion 160.

Next, operation at the conventional housing structure will be described. First, set the guided portion 160 of the fan unit 110 to the U slot 170 of the guide rail 140 to insert the fan unit 110 into the fan unit mounting portion 120. Insertion is enabled without any problem by inserting the fan unit 110 straight on, with the U slot 170 of the guide rail 140 and the guided portion 160 of the fan unit 110 maintained in parallel to each other at any time by keeping a balance between right and left.

Once the balance between right and left is lost and the fan unit 110 slants, for example, as illustrated in FIG. 13, the guided portion 160 slants to the utmost within the U slot 170 of the guide rail 140, resulting in having the apparent width of the guided portion 160 equaling or exceeding the width of the U slot 170 of the guide rail 140. As a result, the guided portion 160 of the fan unit 110 is pressed against the inner wall surface of the U slot 170 to cause a hitch halfway in the insertion of the fan unit 110.

Here, at the time of correcting the right and left slant by pushing the left side, as one faces it, of the fan unit 110 in order to rectify the slant state, if the amount of rectification is too large, a right and left slant reverse to that of FIG. 13 is generated, for example, as illustrated in FIG. 14 to cause a hitch. Repetition of this movement will result in insertion with the unit rocking rightward and leftward in the traveling direction.

As described in the foregoing, a conventional structure for guiding a unit large in breadth by means of a guide rail having a U slot involves rightward and leftward rocking in the traveling direction to cause a hitch, making mounting of the fan unit difficult. This tendency is more enhanced when the guide rail 140 of the fan unit mounting portion 12 and the guided portion 160 of the fan unit 110 are both made of metal for maintaining the ground potentials of the fan unit mounting portion 120 and the fan unit 110 to be the same than that when either the guide rail 140 or the guided portion 160 is made of a resin material.

Although the foregoing description has been made of the structure for housing the fan unit 110 in the fan unit mounting portion 120, structures for housing other electronic units in a unit mounting portion also have the same problem.

SUMMARY OF THE INVENTION

A first object of the present invention is to provide a unit housing structure in an electronic device enabling insertion/extraction of an electronic unit into/from a unit mounting portion of the electronic device by smooth guiding without a hitch caused by rightward and leftward rocking.

According to one aspect of the invention, a unit housing structure for detachably housing a unit mounted with electronic parts in a unit mounting portion of an electronic device, wherein on the side of the unit mounting portion or the unit, a guide rail having a guide slot whose opposite wall surfaces are slopes gradually opening outwardly is provided, on the side of the unit mounting portion or the unit, a guided portion to be slidably engaged with the guide slot of the guide rail is provided, and when the unit is inserted/extracted into/from the unit mounting portion, movement of the unit is guided by the engagement between the guided portion and the guide slot.

In the preferred construction, the guide rail is provided on the side of the unit mounting portion and the guided portion is provided on the side of the unit.

In another preferred construction, the guide rail is disposed at a position of the unit mounting portion which comes under the unit and the guided portion is provided on the lower side of the unit.

In another preferred construction, the guide rail is disposed at a position of the unit mounting portion which comes under the unit and the guided portion is formed on the lower side of the unit, the guide rail is provided fixing on a cross-bar provided within the unit mounting portion, and the guided portion is formed by projecting a lower edge of the side surface of the unit downward.

In another preferred construction, the guide slot is formed to have a quasi V-shaped section.

In another preferred construction, the guide slot is formed to have a plane bottom and have opposite wall surfaces as slopes which gradually open outwardly.

In another preferred construction, the guide rail is disposed at a position of the unit mounting portion which comes under the unit and the guided portion is formed on the lower side of the unit, the guide rail is provided fixing on a cross-bar provided within the unit mounting portion, the guided portion is formed by projecting a lower edge of the side surface of the unit downward, and the guide slot is formed to have a quasi V-shaped section.

In another preferred construction, the guide rail is disposed on the lower side of the unit, and the guided portion is disposed at a position of the unit mounting portion which comes under the unit.

In another preferred construction, the guide rail is disposed at a position of the unit mounting portion which comes under the unit and the guided portion is formed on the lower side of the unit, the guide rail is provided fixing on a cross-bar provided within the unit mounting portion, the guided portion is formed by projecting a lower edge of the side surface of the unit downward, and assuming that an inclination of one of the slopes of the guide slot facing to each other is α1 and an inclination of the other slope is α2 and that a static friction coefficient between the guide slot and the guided portion is $\mu$, the inclinations of the slopes are angles which satisfy the following expressions:

$$\mu < \tan \alpha 1 \text{ and } \mu < \tan \alpha 2.$$

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
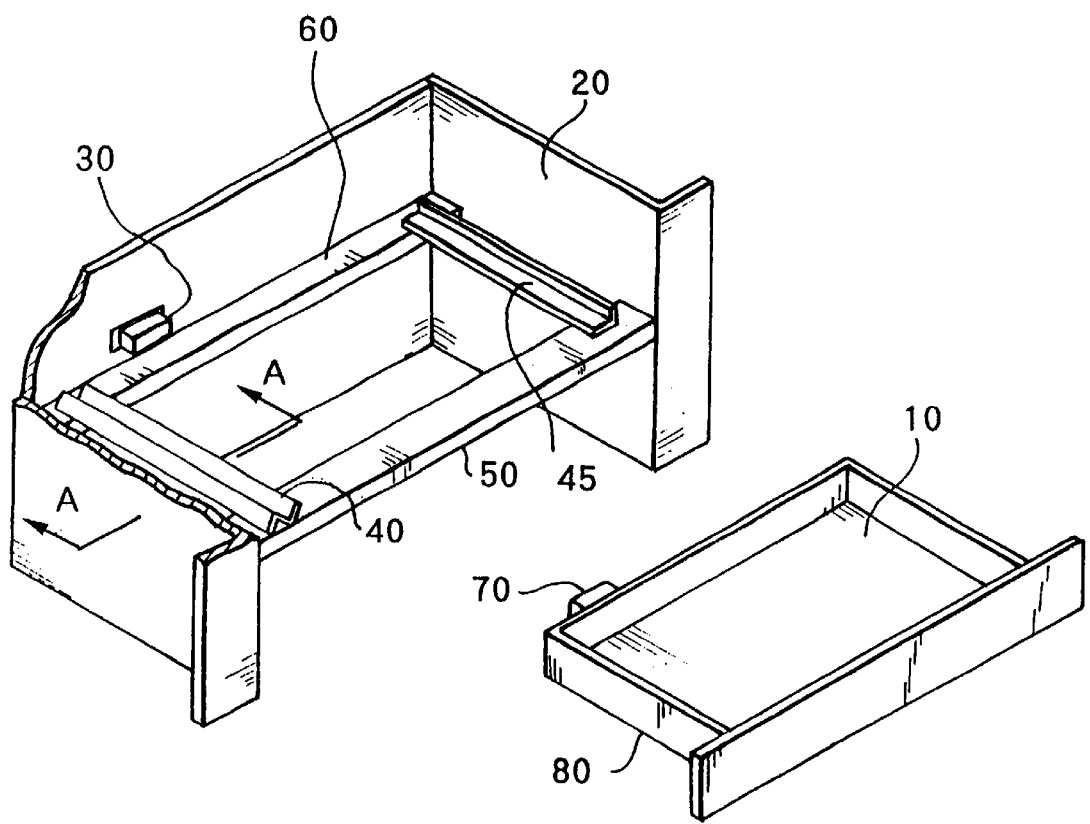
FIG. 1 is a perspective view of a housing structure illustrated as one embodiment of the present invention.

FIG. 1, which shows one embodiment of a housing structure according to the present invention, is a perspective view illustrating a broken-out part of the structure at the state prior to assembly. In FIG. 1, the reference numeral 10 denotes a unit mounted with electronic parts such as fan units and 20 denotes a unit mounting portion provided at the body of an electronic device such as a communication apparatus in which the unit 10 is to be mounted.

The unit mounting portion 20 has a connector 30 for the electrical connection with the unit 10. Although not shown, the connector 30 is connected with the inside of the electronic parts in the electronic device by a cable through which power supply to the unit 10 and transmission and reception of signals between the unit 10 and the electronic device are enabled.

In the housing space of the unit mounting portion 20, two cross-bars 50 and 60 are provided as illustrated in the figure. In addition, on the left side of the unit mounting portion 20, a guide rail 40 for guiding the unit 10 is provided. The guide rail 40, as illustrated in FIG. 2 which is an expanded view of the section taken along line A—A of FIG. 1 with the unit 10 assembled into the unit mounting portion 20, is formed into a rail shape by pressing a metal plate to process the section into a Z-shape.

Figure 2:
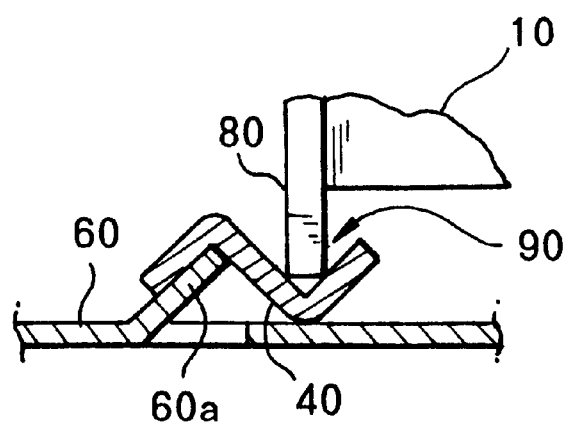
FIG. 2 is an expanded schematic sectional view taken along line A—A of FIG. 1.
Figure 3:
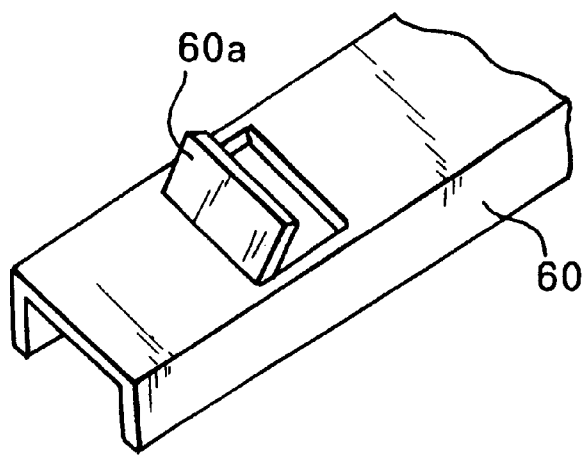
FIG. 3 is a view showing structure of a rise portion of a cross-beam.

By cutting and raising a part of the cross-bar 50 and a part of the cross-bar 60 provided at the unit mounting portion 20 for fixing the above-described guide rail 40, such a rise portion 60a as illustrated in FIGS. 2 and 3 is formed. This rise portion 60a is cut and raised at a predetermined angle and the guide rail 40 is fixed to the rise portion 60a by welding or the like.

In addition, the sectional configuration of a part actually used as a rail is formed to be such a V-shaped guiding slot having slopes whose opposite wall surfaces gradually slant to open from the bottom of the slot as illustrated in FIG. 2 (hereinafter, the slot is referred to as "V-shaped slot 90") and the V-shaped slot 90 guides the sliding unit 10.

Moreover, on the right side of the unit mounting portion 20, a guide member 45 for guiding the right-side surface of the unit 10 is provided. The guide member 45 has its section formed of a L-shaped member as illustrated in FIG. 1 and is fixed on the cross-bars 50 and 60. A space between the above-described guide rail 40 and the guide member 45 is set according to a breadth of the unit 10.

Figure 9:
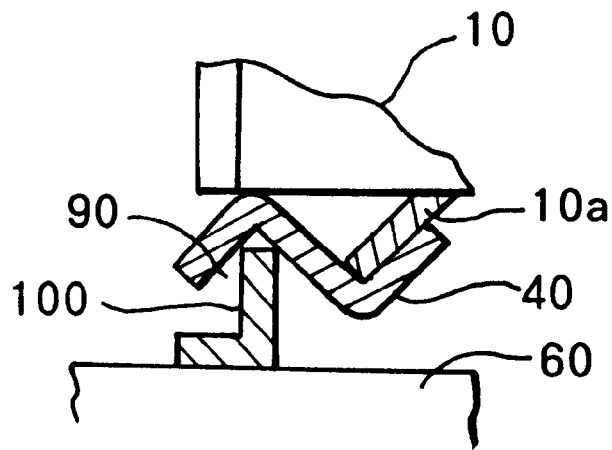
FIG. 9 is a sectional view showing structure of a guide rail and a guided portion according to another embodiment of the present invention.

On the other hand, the unit 10 has a connector 70 at a position opposed to the connector 30 of the unit mounting portion 20. The lower edge of the side surface of the unit 10 projects downward to become a guided portion 80 which will be slidably engaged with the V-shaped slot 90 of the guide rail 40 and will be guided by its sliding in the V-shaped slot 90. Although the unit 10 is mounted with electronic parts such as fan units as illustrated in FIG. 9, its illustration is omitted in the present figure.

Figure 4:
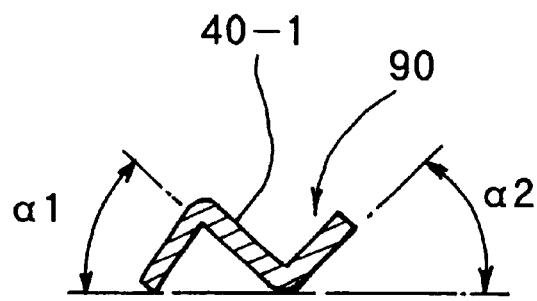
FIG. 4 is an expanded sectional view of a guide rail.

As to the V-shaped slot 90, description will be here made with reference to FIG. 4 which is an expanded sectional view of the guide rail 40 only. Assuming that of the opposite slopes opposed to each other of the V-shaped slot 90, an angle of one slope is $\alpha 1$ and an inclination of the other slope is $\alpha 2$, and that a static friction coefficient between the guided portion 80 of the unit 10 and the guide rail 40 is $\mu$, $\mu < \tan \alpha 1$ and $\mu < \tan \alpha 2$ hold for the V-shaped slot 90. More specifically, the angles $\alpha 1$ and $\alpha 2$ of the slopes of the V-shaped slot 90 are larger than a static friction angle with the guided portion 80 of the unit 10 as a friction piece and the guide rail 40 as a friction surface.

Next, description will be made of operation to be conducted for inserting the unit 10 into the unit mounting portion 20.

First, set the guided portion 80 of the unit 10 to the V-shaped slot 90 as a guide slot of the guide rail 40 to insert the unit 10 into the unit mounting portion 20. When the unit 10 slants leftward or rightward in the traveling direction halfway in the insertion, the guided portion 80 of the unit 10 will start ascending the slanting wall surface of the V-shaped slot 90 of the guide rail 40.

Figure 5:
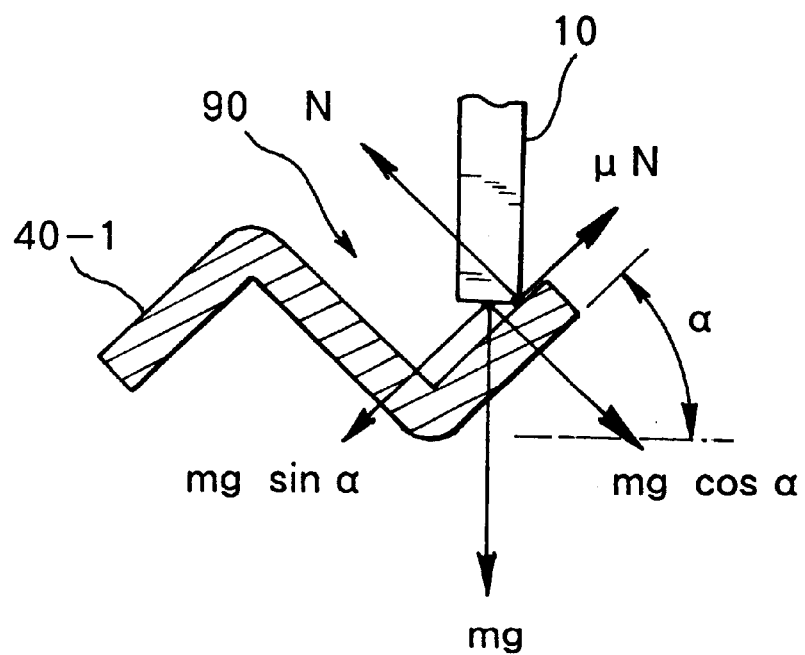
FIG. 5 is an explanatory view of operation of the device according to the present invention.

Then, as illustrated in FIG. 5, to the guided portion 80 of the unit 10, force of gravity mg, vertical reaction force N on the contact surface and friction force $\mu N$ will act. Here, since an inclination $\alpha$ of the V-shaped slot 90 of the guide rail 40 is larger than a static friction angle between the guided portion 80 of the unit 10 and the guide rail 40, $mg \sin \alpha > \mu N$ holds to result in that the guided portion 80 of the unit 10 slides down toward the center of the V-shaped slot 90 of the guide rail 40. Thus, even when the unit 10 starts slanting rightward or leftward, force will act to the direction for rectifying the slant to suppress the slant. As a result, the unit 10 continues proceeding without rightward and leftward slanting to be inserted up to a predetermined position. At the final position, the connector 70 will be fit in the connector 30 and connected to complete assembly.

Conversely, in a case where the unit 10 is to be extracted, when the unit 10 is on the edge of slanting leftward or rightward in the travelling direction, force will act on the guided portion 80 in a direction for rectifying the slant of the unit 10 due to the slopes of the V-shaped slot 90 to suppress the slant. As a result, also at the extraction of the unit 10 from the unit mounting portion 20, the unit 10 is guided smoothly and extracted without leftward and rightward rocking in the extraction direction to cause a hitch.

As described in the foregoing, with the guide slot 90 of the guide rail 40 structured to have slanting wall surfaces, when the unit 10 is on the edge of slanting leftward or rightward in the traveling direction, the guided portion 80 will start ascending or descending on the slope of the guide slot 90, resulting in that force will act on the guided portion 80 to move toward the center of the guide slot 90, that is, force will act toward the direction to rectify the slant of the unit 10 to suppress the slant. Accordingly, at the insertion/extraction into/from the unit mounting portion 20, the unit 10 can be guided smoothly without rightward and leftward rocking in the proceeding/extraction direction to cause a hitch.

Since thus formed unit housing structure at a communication apparatus enables even a unit large in breadth to operate without leftward and rightward rocking in the traveling direction to cause a hitch at the insertion/extraction, work efficiency can be improved.

The above-described embodiment can be also structured as follows.

Figure 6:
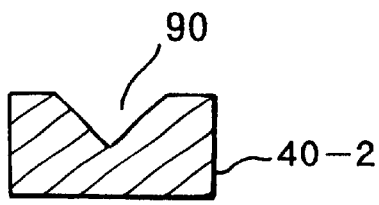
FIG. 6 is a sectional view for use in explaining one example of modification of the device according to the present invention.

In the above-described embodiment, the guide rail 40 is formed of a pressed metal plate material or the like, it may be formed, for example, of a prism-shaped member as illustrated in FIG. 6 as long as the V-shaped slot 90 as a guide slot is provided. In addition, processing method may be, casting, cutting work, extruding or any other method.

Figure 7:
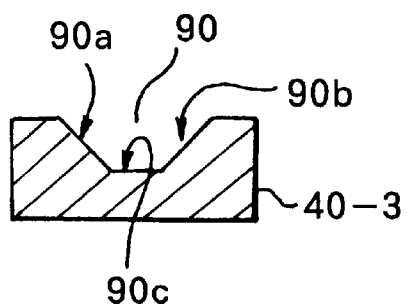
FIG. 7 is a sectional view for use in explaining another example of modification of the device according to the present invention.

Moreover, the guide slot of the guide rail 40 may not be formed into a complete V-shape but be formed to have a flat bottom surface 90c and have wall surfaces 90a and 90b on opposite sides of the slot as slopes which gradually slant inwardly toward the bottom surface 90c as illustrated in FIG. 7. With such structure, the same effect can be achieved.

Figure 8:
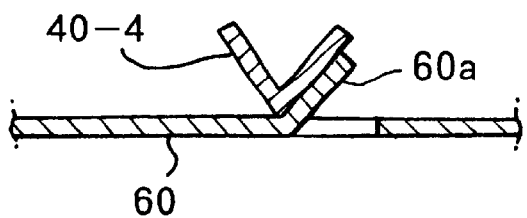
FIG. 8 is a sectional view showing another structure of the guide rail.

In addition, the guide slot of the guide rail 40 may not be Z-shaped as illustrated in FIG. 2 but be formed to be V-shaped by the pressing or other processing of a metal plate material and fixed to the rise portion 60a of the cross-bar 60 as shown in FIG. 8.

Although the above-described embodiment is structured to have the guide rail 40 having the guide slot (V-shaped slot 90) provided on the side of the unit mounting portion 20 and the guided portion 80 provided on the side of the unit 10, the same effect can be achieved by a structure conversely having the guide rail 40 with the guide slot (V-shaped slot 90) provided on the side of the unit 10 and a guided portion 100 provided on the side of the unit mounting portion 20 as illustrated in FIG. 9. In FIG. 9, a part of the bottom surface of the unit 10 is cut and raised to form a riser portion 10a to which the guide rail 40 is fixed so as to have the V-shaped slot 90 face downward, and the guided portion 100 made of a member whose section is L-shaped is fixed on the cross-bar 60.

Figure 10:
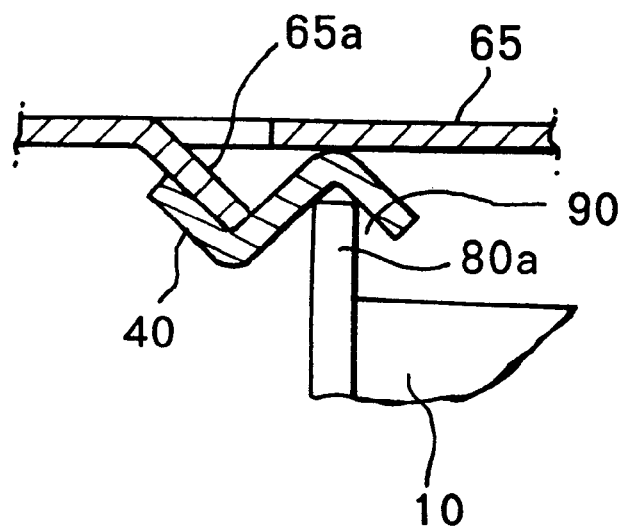
FIG. 10 is a sectional view showing structure of a guide rail and a guided portion according to a further embodiment of the present invention.
Figure 11:
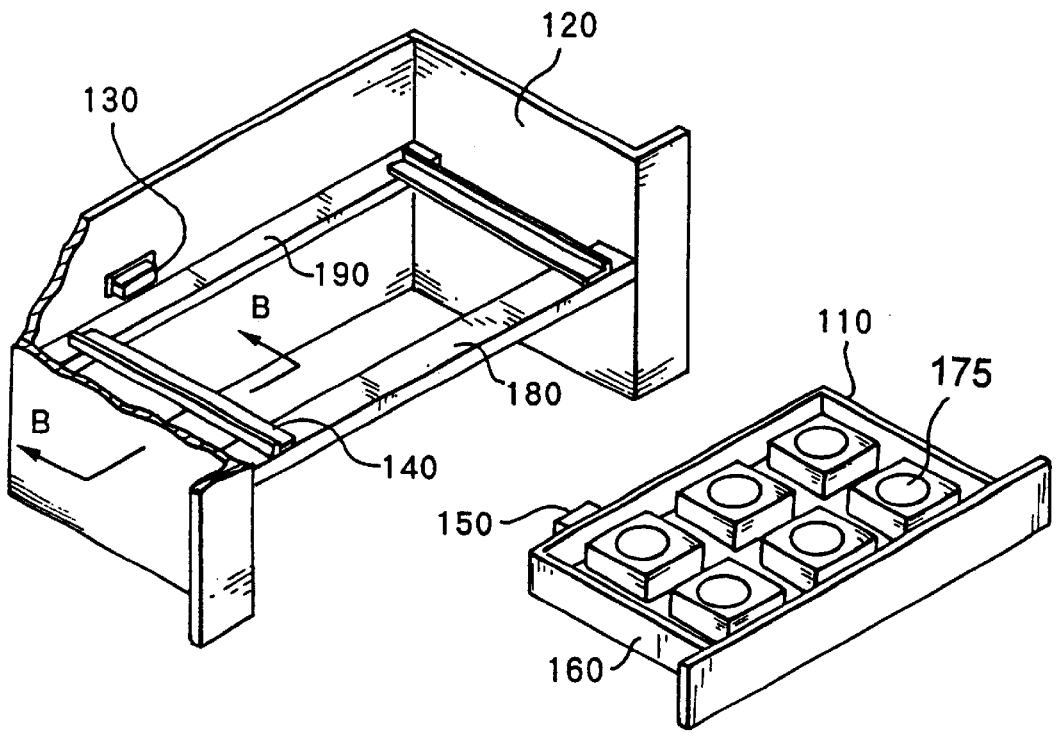
FIG. 11 is a perspective view showing schematic structure of a conventional device.
Figure 12:
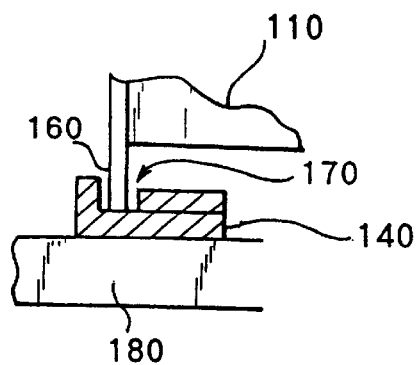
FIG. 12 is an expanded sectional view taken along line B—B of FIG. 9.
Figure 13:
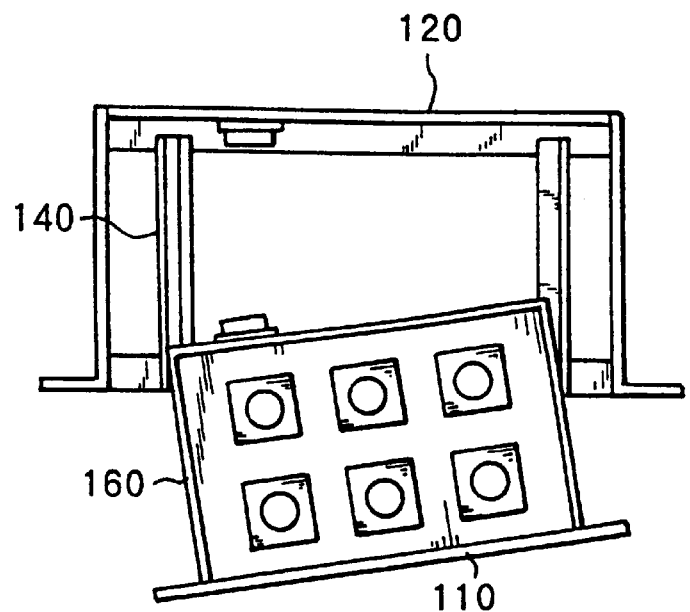
FIG. 13 is a view for use in explaining a problem of the conventional device.
Figure 14:
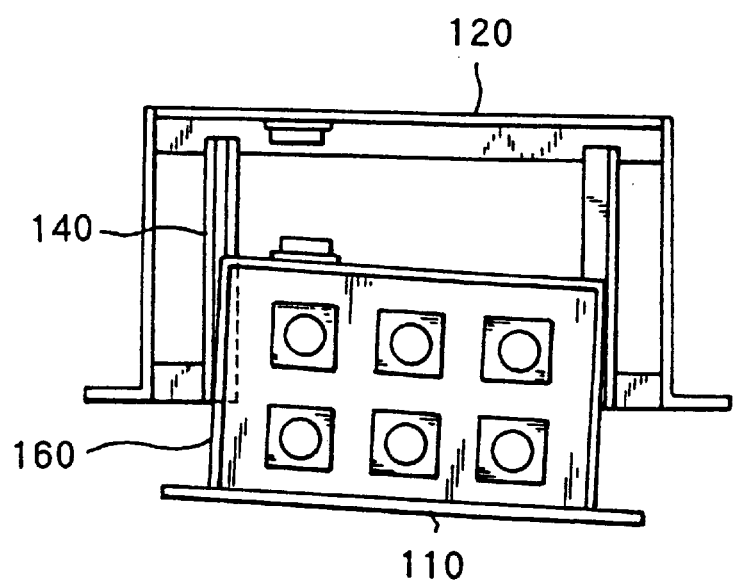
FIG. 14 is a view for use in explaining the problem of the conventional device.

While the above-described embodiment is structured to have the guided portion 80 formed at the lower edge of the side surface of the unit 10 and the guide rail 40 having the guide slot (V-shaped slot 90) located below the unit 10, it may be conversely structured as illustrated in FIG. 10 to have the upper edge of the side surface of the unit 10 projecting to become a guided portion 80a and the guide rail 40 having the guide slot (V-shaped slot 90) located above the unit 10. In FIG. 10, in the housing space of the unit mounting portion 20, a cross-bar 65 located above the unit 10 is provided, a riser portion 65a facing downward is formed on the cross-bar 65, and the guide rail 40 is fixed to the riser portion 65a so as to have the V-shaped slot 90 face downward. In addition, at the upper edge of the side surface of the unit 10, the guided portion 80a to be fit in the above-described V-shaped slot 90 is formed.

In this embodiment, the same cross-bars 50 and 60 as those of FIG. 1 are provided in the unit mounting portion 20 at a position which comes under the unit 10 and on the right and the left sides of the cross-bars 50 and 60, the guide member 45 whose section is L-shaped is provided.

Thus structured present invention enables even a unit large in breadth to operate smoothly at its insertion/extraction without rightward and leftward rocking in the traveling direction to cause a hitch and to be guided to a desired position within the unit mounting portion, thereby improving work efficiency.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A unit housing structure, comprising:
   an electronic device having a unit mounting portion;
   a fan unit detachably mounted to said unit mounting portion;
   a guide rail having a guide slot extending along a length of said guide rail, said guide slot having outwardly sloped opposing wall surfaces along the length of said guide rail which gradually slant away from one another beginning at a bottom surface of said guide slot, said guide rail being mounted on a side of said unit mounting portion or a side of said fan unit via an extending raised portion fixed to one of the outwardly sloped opposing wall surfaces, said raised portion extending from one of the fan unit and unit mounting portion; and
   a guided portion slidably engageable with the guide slot of said guide rail, said guided portion being mounted on the side of said unit mounting portion or the side of said fan unit;
   wherein when said fan unit is either inserted into or extracted from said unit mounting portion, movement of said fan unit is guided by engagement between said guided portion and the guide slot.

2. The unit housing structure as set forth in claim 1, wherein
   said guide rail is provided on the side of said unit mounting portion and said guided portion is provided on the side of said fan unit.

3. The unit housing structure as set forth in claim 1, wherein
   said guide rail is disposed at a position of said unit mounting portion which comes under said fan unit and said guided portion is provided on the lower side of said unit.

4. The unit housing structure as set forth in claim 1, wherein
   said guide rail is disposed at a position of said unit mounting portion which comes under said fan unit and said guided portion is formed on the lower side of said unit,
   said guide rail is provided fixing on a cross-bar provided within said unit mounting portion, and
   said guided portion is formed by projecting a lower edge of the side surface of said fan unit downward.

5. The unit housing structure as set forth in claim 1, wherein
   said guide slot is formed to have a quasi V-shaped section.

6. The unit housing structure as set forth in claim 1, wherein
   said guide slot is formed to have a plane bottom and have opposite wall surfaces as slopes which gradually open outwardly.

7. The unit housing structure as set forth in claim 1, wherein
   said guide rail is disposed at a position of said unit mounting portion which comes under said fan unit and said guided portion is formed on the lower side of said fan unit,
   said guide rail is provided fixing on a cross-bar provided within said unit mounting portion,
   said guided position is formed by projecting a lower edge of the side surface of said fan unit downward, and
   said guide slot is formed to have a quasi V-shaped section.

8. The unit housing structure as set forth in claim 1, wherein said guide rail is disposed on the lower side of said fan unit, and said guided portion is disposed at a position of said unit mounting portion which comes under said fan unit.

9. The unit housing structure as set forth in claim 1, wherein assuming that an inclination of one of said slopes of said guide slot facing to each other is α1 and an inclination of the other slope is α2 and that a static friction coefficient between said guide slot and said guided portion is μ, the inclinations of said slopes are angles which satisfy the following expressions:

$$\beta < \tan \alpha 1 \text{ and } \mu < \tan \alpha 2.$$

10. The unit housing structure as set forth in claim 1, wherein said guide rail is disposed at a position of said unit mounting portion which comes under said fan unit and said guided portion is formed on the lower side of said fan unit, said guide rail is provided fixing on a cross-bar provided within said unit mounting portion, said guided portion is formed by projecting a lower edge of the side surface of said fan unit downward, and assuming that an inclination of one of said slopes of said guide slot facing to each other is α1 and an inclination of the other slope is α2 and that a static friction coefficient between said guide slot and said guided portion is μ, the inclinations of said slopes are angles which satisfy the following expressions:

$$\mu < \tan \alpha 1 \text{ and } \mu < \tan \alpha 2.$$

11. The unit housing structure as set forth in claim 1, wherein said guide rail is a Z-shaped and said guide slot is formed from a V portion of the Z-shaped guide rail.

12. The unit housing structure as set forth in claim 1, wherein said guide slot is V-shaped with a flat bottom surface, wherein the wall surfaces on opposite sides of said guide slot are sloped inwardly toward the bottom surface.

13. The unit housing structure as set forth in claim 12, wherein when said unit is either inserted into or extracted from said unit mounting portion, movement of said fan unit is guided to the flat bottom surface of said guide slot by the engagement between said guided portion and said guide slot.

14. The unit structure as set forth in claim 1, wherein when said unit is either inserted into or extracted from said unit mounting portion, said fan unit is aligned such that said fan unit is smoothly guided to a bottom of said guide slot.

15. The unit structure as set forth in claim 1, wherein an upper end of the outwardly sloped opposing wall surfaces has a spacing therebetween larger than a width of said guided portion.

* * * * *